United States Patent
Qu et al.

(10) Patent No.: US 11,145,570 B2
(45) Date of Patent: Oct. 12, 2021

(54) CLOSED LOOP LIQUID COOLER AND ELECTRONIC DEVICE USING THE SAME

(71) Applicant: CELESTICA TECHNOLOGY CONSULTANCY (SHANGHAI) CO. LTD, Shanghai (CN)

(72) Inventors: Zhongjiang Qu, Shanghai (CN); Yaoyin Fan, Shanghai (CN)

(73) Assignee: CELESTICA TECHNOLOGY CONSULTANCY (SHANGHAI) CO. LTD, Shanghai (CN)

(*) Notice: Subject to any disclaimer, the term of this patent is extended or adjusted under 35 U.S.C. 154(b) by 79 days.

(21) Appl. No.: 16/234,886

(22) Filed: Dec. 28, 2018

(65) Prior Publication Data

US 2019/0206765 A1    Jul. 4, 2019

(51) Int. Cl.
*H01L 23/473* (2006.01)
*H01L 23/467* (2006.01)

(52) U.S. Cl.
CPC .......... *H01L 23/473* (2013.01); *H01L 23/467* (2013.01)

(58) Field of Classification Search
CPC .......................... H01L 23/473; H01L 23/467
See application file for complete search history.

(56) References Cited

U.S. PATENT DOCUMENTS

| | | | | |
|---|---|---|---|---|
| 6,504,720 B2 * | 1/2003 | Furuya | .................. | H01L 23/427 165/104.33 |
| 7,086,453 B2 * | 8/2006 | Lee | .................... | H01L 23/3672 165/104.33 |
| 8,522,570 B2 * | 9/2013 | Ouyang | .................. | H01L 35/30 62/259.2 |
| 9,818,671 B2 * | 11/2017 | Huang | .................. | G06F 1/20 |
| 10,117,364 B2 * | 10/2018 | Morton | .................. | G02F 1/133385 |
| 10,199,308 B2 * | 2/2019 | Huang | .................. | H01L 23/473 |
| 10,306,804 B2 * | 5/2019 | Chester | .................. | H05K 7/20218 |
| 10,410,954 B2 * | 9/2019 | Sun | .................. | F28D 15/02 |
| 10,874,034 B1 * | 12/2020 | Chen | .................. | H05K 7/20772 |
| 2002/0036890 A1 * | 3/2002 | Furuya | .................. | H01L 23/427 361/702 |
| 2005/0056404 A1 * | 3/2005 | Lee | .................. | H01L 23/467 165/104.33 |
| 2007/0107441 A1 * | 5/2007 | Lee | .................. | F25B 21/02 62/3.7 |
| 2007/0159797 A1 * | 7/2007 | Teneketges | .................. | H01L 23/473 361/699 |
| 2009/0308081 A1 * | 12/2009 | Ouyang | .................. | H01L 35/30 62/3.2 |
| 2010/0128436 A1 * | 5/2010 | Edmunds | .................. | F28D 15/0233 361/700 |

(Continued)

FOREIGN PATENT DOCUMENTS

EP    0767601 A1 *  4/1997   ......... H05K 7/20272

*Primary Examiner* — Ljiljana V. Ciric
(74) *Attorney, Agent, or Firm* — Global IP Services; Tianhua Gu

(57) ABSTRACT

A closed loop liquid cooler and an electronic device using the same. The closed loop liquid cooler includes: a first liquid cooling module and a second liquid cooling module, where a cooling reflux at an output end of the first liquid cooling module is outputted to a cooling liquid input end of the second liquid cooling module; and a cooling reflux at an output end of the second liquid cooling module is outputted to a cooling liquid input end of the first liquid cooling module.

5 Claims, 2 Drawing Sheets

(56) References Cited

U.S. PATENT DOCUMENTS

| | | | | |
|---|---|---|---|---|
| 2010/0279154 A1* | 11/2010 | Koetting | ........... | H01M 10/6568 429/50 |
| 2013/0094139 A1* | 4/2013 | Campbell | .......... | H05K 7/20772 361/679.47 |
| 2017/0231121 A1* | 8/2017 | Morton | .............. | H05K 7/20981 |
| 2018/0308786 A1* | 10/2018 | Huang | .................. | H01L 23/433 |

* cited by examiner

CLOSED LOOP LIQUID COOLER AND ELECTRONIC DEVICE USING THE SAME

CROSS REFERENCES TO RELATED APPLICATIONS

This application claims the benefits of priority to Chinese Patent Application No. CN 201711476707X, entitled "Closed loop Liquid Cooler and Electronic Device Using the Same", filed with the Chinese Patent Office on Dec. 29, 2017, and Chinese Patent Application No. CN2017219181385, entitled "Closed loop Liquid Cooler and Electronic Device Using the Same", filed with the Chinese Patent Office on Dec. 29, 2017, the contents of which are incorporated herein by reference in its entirety.

BACKGROUND OF THE PRESENT INVENTION

Field of Invention

The present application relates to technical filed of electronic device, and in particular, to a closed loop liquid cooler and an electronic device using the same.

Description of Related Arts

A closed loop liquid cooler is used for cooling elements with high power consumption in an electronic device. In closed loop liquid coolers of general designs, one design is that the liquid flows through a plurality of heating elements in sequence. A heat cascade effect among the heating elements causes the temperature difference between every two elements is approximately 5° C. The heat cascade effect becomes more serious as the quantity of elements increases. The heat cascade effect considerably lowers system cooling efficiency.

Another design in the general designs is that two independent liquid cooling circulation systems cool respective chips. When a pump in a liquid cooling system fails, the liquid circulation is interrupted, which results in failure of the liquid cooling system, the corresponding chip will stop working due to an excessively high temperature, thereby severely affecting system services.

SUMMARY OF THE PRESENT INVENTION

In view of the foregoing disadvantages of the prior art, the present application provides a closed loop liquid cooler and an electronic device using the same, so as to resolve the problem in the prior art, such as severe heat cascade effect of liquid coolers, or easily interrupting of circulation.

In order to accomplish the above and other related objectives, the present application provides a closed loop liquid cooler. The closed loop liquid cooler comprises a first liquid cooling module and a second liquid cooling module; a cooling reflux at an output end of the first liquid cooling module is outputted to a cooling liquid input end of the second liquid cooling module; and a cooling reflux at an output end of the second liquid cooling module is outputted to a cooling liquid input end of the first liquid cooling module.

In an embodiment of the present application, the first liquid cooling module comprises a first heat exchanger, a first pump body, a first cold plate and a first pipeline unit; the second liquid cooling module comprises a second heat exchanger, a second pump body, a second cold plate and a second pipeline unit.

In an embodiment of the present application, the first pipeline unit comprises a first connection pipeline and a second connection pipeline; and the second pipeline unit comprises a third connection pipeline and a fourth connection pipeline.

In an embodiment of the present application, the first pump body is integrated with the first cold plate to form a first integrated structure; the first connection pipeline is connected between the first heat exchanger and the first integrated structure; and the second connection pipeline is connected between the first integrated structure and the second heat exchanger.

In an embodiment of the present application, in the first integrated structure, the first pump body is connected to the first connection pipeline, and the first cold plate is connected to the second connection pipeline; or the first cold plate is connected to the first connection pipeline, and the first pump body is connected to the second connection pipeline.

In an embodiment of the present application, the first connection pipeline is connected between the first heat exchanger and the first cold plate; the second connection pipeline is connected between the first cold plate and the second heat exchanger; and the first pump body is connected on the first connection pipeline or the second connection pipeline.

In an embodiment of the present application, the second pump body is integrated with the second cold plate to form a second integrated structure; the third connection pipeline is connected between the second heat exchanger and the second integrated structure; and the fourth connection pipeline is connected between the second integrated structure and the first heat exchanger.

In an embodiment of the present application, in the second integrated structure, the second pump body is connected to the third connection pipeline, and the second cold plate is connected to the fourth connection pipeline; or the second cold plate is connected to the third connection pipeline, and the second pump body is connected to the fourth connection pipeline.

In an embodiment of the present application, the third connection pipeline is connected between the second heat exchanger and the second cold plate; the fourth connection pipeline is connected between the second cold plate and the first heat exchanger; and the second pump body is connected on the third connection pipeline or the fourth connection pipeline.

In an embodiment of the present application, the first liquid cooling module further comprises a first fan unit installed on the first heat exchanger, and the second liquid cooling module further comprises a second fan unit installed on the second heat exchanger.

An embodiment of the present application further provides an electronic device, comprising the closed loop liquid cooler described above.

As described above, a pipeline connection solution proposed in the closed loop liquid cooler according to the present application effectively overcomes a heat cascade effect among a plurality of chips in a liquid cooling design, ensures a system cooling redundancy design, and solves a thermal design issue caused by a single-point failure (failure of a single pump) of a liquid cooling system, thereby greatly improving the overall cooling capability and cooling reliability of the system, and achieving high economical efficiency and practicability.

DESCRIPTIONS OF COMPONENT MARK NUMBERS

Figure 1:
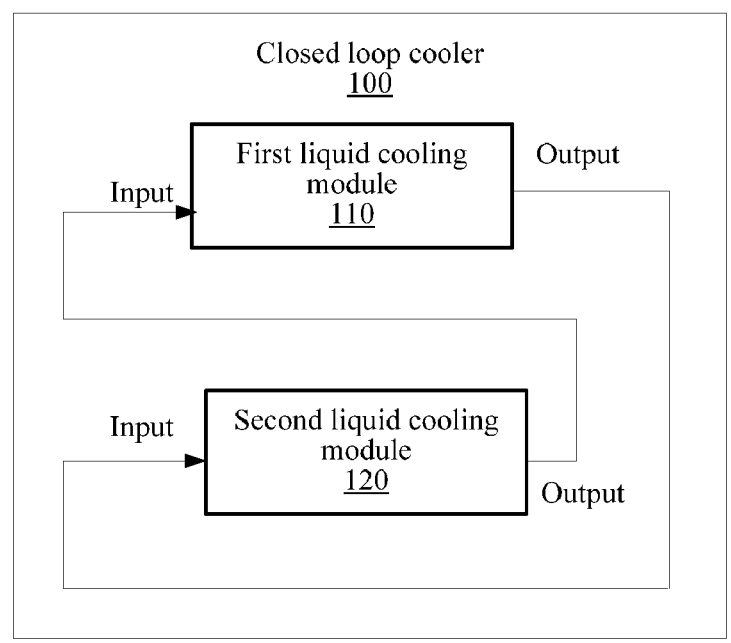
FIG. 1 is a schematic diagram of principle of a closed loop liquid cooler according to the present disclosure.

100 Closed loop liquid cooler
110 First liquid cooling module
111 First heat exchanger
112 First pump body
113 First cold plate
114 First connection pipeline
115 Second connection pipeline
116 First fan unit
120 Second liquid cooling module
121 Second heat exchanger
122 Second pump body
123 Second cold plate
124 Third connection pipeline
125 Fourth connection pipeline
126 Second fan unit

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure. It should be noted that, when not conflict, the following embodiments, and the features in the embodiments can be combined with each other It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

This embodiment provides a closed loop liquid cooler and an electronic device using the same, so as to resolve the problem in the prior art that a heat cascade effect of liquid coolers is severe or circulation is interrupted easily. Principles and implementations of the closed loop liquid cooler and the electronic device using the same according to this embodiment will be described in detail in the following, so that those skilled in the art can understand the closed loop liquid cooler and the electronic device using the same according to this embodiment without making creative efforts.

Figure 2:
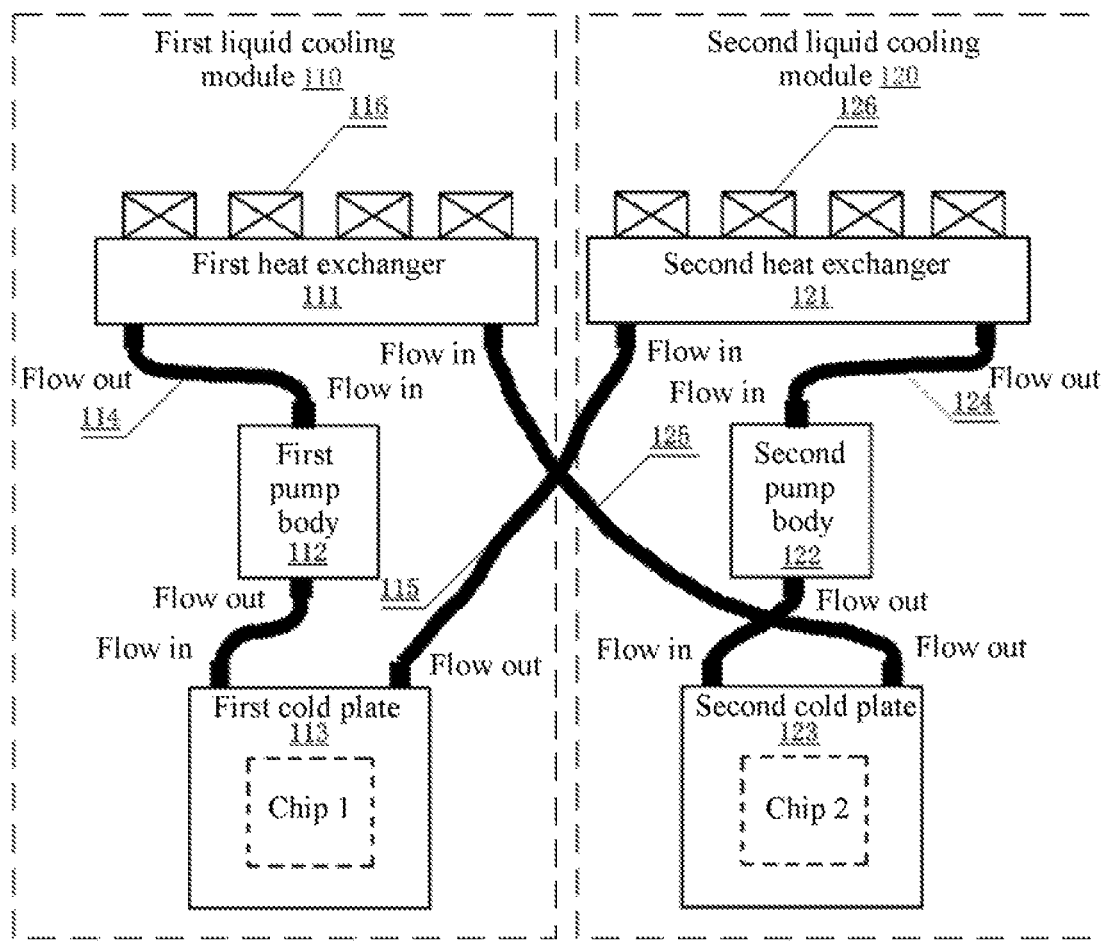
FIG. 2 is a schematic diagram of a closed loop liquid cooler according to the present disclosure.

Referring to FIG. 1 and FIG. 2, schematic diagram of a closed loop liquid cooler 100 according to the present disclosure in an embodiment is shown.

As shown in FIG. 1, the closed loop liquid cooler 100 includes a first liquid cooling module 110 and a second liquid cooling module 120. The cooling reflux at the output end of the first liquid cooling module 110 is outputted to the cooling liquid input end of the second liquid cooling module 120; and a cooling reflux at the output end of the second liquid cooling module 120 is outputted to the cooling liquid input end of the first liquid cooling module 110.

Specifically, as shown in FIG. 2, in an embodiment, the first liquid cooling module 110 comprises a first heat exchanger 111, a first pump body 112, a first cold plate 113, and a first pipeline unit. The second liquid cooling module 120 comprises a second heat exchanger 121, a second pump body 122, a second cold plate 123, and a second pipeline unit.

The following is detailed description of the structures of the first liquid cooling module 110 and the second liquid cooling module 120.

In an embodiment, the first pipeline unit comprises a first connection pipeline 114 and a second connection pipeline 115.

The first pump body 112 and the first cold plate 113 may be integrated or may be connected as separate entities. An element to be cooled (such as a chip) is disposed on the first cold plate 113 for cooling.

Specifically, in an embodiment, the first pump body 112 and the first cold plate 113 are integrated to form a first integrated structure.

When the first pump body 112 and the first cold plate 113 are integrated to form the first integrated structure, the first connection pipeline 114 is connected between the first heat exchanger 111 and the first integrated structure; the second connection pipeline 115 is connected between the first integrated structure and the second heat exchanger 121.

A cooling liquid flows out from the first heat exchanger 111, and flows into the first integrated structure through the first connection pipeline 114, so as to cool the elements. The reflux liquid after cooling flows to the second heat exchanger 121 through the second connection pipeline 115.

In an embodiment, in the first integrated structure, the first pump body 112 is connected to the first connection pipeline 114, and the first cold plate 113 is connected to the second connection pipeline 115; or the first cold plate 113 is connected to the first connection pipeline 114, and the first pump body 112 is connected to the second connection pipeline 115.

In another embodiment, the first pump body 112 and the first cold plate 113 are connected as separate entities.

Specifically, the first connection pipeline 114 is connected between the first heat exchanger 111 and the first cold plate 113; the second connection pipeline 115 is connected between the first cold plate 113 and the second heat exchanger 121; the first pump body 112 is connected on the first connection pipeline 114 or on the second connection pipeline 115.

The cooling liquid flows out from the first heat exchanger 111, and flows into the first cold plate 113 through the first connection pipeline 114 and the first pump body 112 on the first connection pipeline 114, to cool the element. The reflux liquid after cooling flows to the second heat exchanger 121 through the second connection pipeline 115. Alternatively, the cooling liquid flows out from the first heat exchanger 111, and flows into the first cold plate 113 through the first connection pipeline 114, to cool the elements. The reflux liquid after cooling flows to the second heat exchanger 121 through the second connection pipeline 115 and the first pump body 112 on the second connection pipeline 115.

In an embodiment, the first liquid cooling module 110 further comprises a first fan unit 116 installed on the first heat exchanger 111. As shown in FIG. 2, the first fan unit 116 comprises a plurality of fans.

The first heat exchanger 111 is installed on the outlet side of the fans, so that air blown by the fans flows through the first heat exchanger 111 and is mixed with cold air of the first heat exchanger 111. Alternatively, the first heat exchanger 111 is installed on a rear surface opposite to the air outlet side of the fans, so that the cold air passes through the first heat exchanger 111 and the fans in sequence, and is blown to the elements through the fans.

In an embodiment, the second pipeline unit comprises a third connection pipeline 124 and a fourth connection pipeline 125.

The second pump body 122 and the second cold plate 123 may be integrated or may be connected as separate entities. An element to be cooled (such as a chip) is disposed on the second cold plate 123 for cooling.

In an embodiment, the second pump body 122 and the second cold plate 123 are integrated to form a second integrated structure.

When the second pump body 122 and the second cold plate 123 are integrated to form the second integrated structure, the third connection pipeline 124 is connected between the second heat exchanger 121 and the second integrated structure; and the fourth connection pipeline 125 is connected between the second integrated structure and the first heat exchanger 111.

The cooling liquid flowing out from the first cold plate 113 enters the second heat exchanger 121; after being cooled by the second heat exchanger 121, the cooling liquid flows out from the second heat exchanger 121, and flows into the second integrated structure through the third connection pipeline 124, to cool the elements. The reflux liquid after cooling flows to the first heat exchanger 111 through the fourth connection pipeline 125.

In an embodiment, in the second integrated structure, the second pump body 122 is connected to the third connection pipeline 124, and the second cold plate 123 is connected to the fourth connection pipeline 125; or in the second integrated structure, the second cold plate 123 is connected to the third connection pipeline 124, and the second pump body 122 is connected to the fourth connection pipeline 125.

In another embodiment, the second pump body 122 and the second cold plate 123 are connected as separate entities.

Specifically, in another embodiment, the third connection pipeline 124 is connected between the second heat exchanger 121 and the second cold plate 123; the fourth connection pipeline 125 is connected between the second cold plate 123 and the first heat exchanger 111; the second pump body 122 is connected on the third connection pipeline 124 or the fourth connection pipeline 125.

The cooling liquid flows out from the second heat exchanger 121, and flows into the second cold plate 123 through the third connection pipeline 124 and the second pump body 122 on the third connection pipeline 124, to cool the elements. The reflux liquid after cooling flows to the first heat exchanger 111 through the fourth connection pipeline 125. Alternatively, the cooling liquid flows out from the first heat exchanger 111, and flows into the second cold plate 123 through the third connection pipeline 124, to cool the elements. The reflux liquid after cooling flows to the first heat exchanger 111 through the fourth connection pipeline 125 and the second pump body 122 on the fourth connection pipeline 125.

In an embodiment, the second liquid cooling module 120 further comprises a second fan unit 126 installed on the second heat exchanger 121. As shown in FIG. 2, the second fan unit 126 comprises a plurality of fans.

The second heat exchanger 121 is installed on an air outlet side of the fans, so that an air blown by the fans flows through the second heat exchanger 121 and is mixed with cold air of the second heat exchanger 121. Alternatively, the second heat exchanger 121 is installed on a rear surface opposite to the air outlet side of the fans, so that the cold air passes through the second heat exchanger 121 and the fans in sequence, and is blown through the fans to the elements.

A working process of the closed loop liquid cooler 100 in this embodiment is as follows:

Heat absorbed by the first cold plate 113 from the chip 1 is delivered by the liquid from the first pump body 112 to the second heat exchanger 121 through the pipeline, and in this case, the liquid is at a high temperature. The second heat exchanger 121 cools the high-temperature liquid, and then the second pump body 122 delivers the liquid, which is at a low temperature after cooling, to the second cold plate 123, so as to cool the chip 2. The second cold plate 123 absorbs heat of the second chip, and then the heat is delivered from the second pump body 122 to the first heat exchanger 111 through the pipeline. The first heat exchanger 111 cools the high-temperature liquid, and the liquid after cooling is delivered from the first pump body 112 to the first cold plate 113 through the pipeline, so as to cool the chip 1. The liquid flows in a cycle. Because the chip 1 and the chip 2 are both cooled by the low-temperature liquid, heat cascade does not exist, and the temperature is low.

Even one of the first pump body 112 and the second pump body 122 fails, the other pump can keep normal circulation of the liquid, thereby ensuring reliability of cooling.

In addition, the present disclosure further provides an electronic device, comprising the closed loop liquid cooler 100 described above. The closed loop liquid cooler 100 has been described in detail, thus is not described herein again. The electronic device is preferably a switch, or an electronic device such as a server. In conclusion, a pipeline connection solution proposed in the closed loop liquid cooler according to the present disclosure effectively overcomes a heat cascade effect among a plurality of chips in a liquid cooling design, ensures a system cooling redundancy design, and solves a thermal design issue caused by a single-point failure (failure of a single pump) of a liquid cooling system, thereby greatly improving the overall cooling capability and cooling reliability of the system, and achieving high economical efficiency and practicability. Therefore, the present disclosure effectively overcomes various disadvantages in the prior art and hence has high industrial use value.

The foregoing embodiments are only to illustrate the principle and efficacy of the present disclosure exemplarily, and are not to limit the present disclosure. Any person skilled in the art can make modifications or variations on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

What is claimed is:

1. A closed loop liquid cooler; comprising:
   a first liquid cooling module comprising a first heat exchanger (111), a first pump body (112), a first cold plate (113) and a first connection pipeline (114) for connecting the first heat exchanger (111) with the first pump body (112) and first cold plate (113) together;

a second liquid cooling module comprising a second heat exchanger (121), a second pump body (122), a second cold plate (113) and a third connection pipeline (124) for connecting the second heat exchanger (121) with the second pump body (122) and second cold plate (123) together;

a second connection pipeline (115) for connecting the first cold plate (113) with the second heat exchanger (121);

a fourth connection pipeline (125) for connecting the second cold plate (123) with the first heat exchanger (111);

wherein a cooling reflux at an output end of the first cold plate (111) of the first liquid cooling module is outputted to a cooling liquid input end of the second heat exchanger (121) of the second liquid cooling module; and a cooling reflux at an output end of the second cold plate (123) of the second liquid cooling module is outputted to a cooling liquid input end of the first heat exchanger (111) of the first liquid cooling module.

2. The closed loop liquid cooler according to claim 1, wherein the first pump body (112) is integrated with the first cold plate (113) to form a first integrated structure (112-113), thereby the first connection pipeline (114) is connected between the first heat exchanger (111) and the first integrated structure (112-113); and the second connection pipeline (115) is connected between the first integrated structure and the second heat exchanger (121).

3. The closed loop liquid cooler according to claim 1, wherein the second pump body (122) is integrated with the second cold plate (123) to form a second integrated structure (122-123); thereby the third connection pipeline (124) is connected between the second heat exchanger (121) and the second integrated structure (122-123); and the fourth connection pipeline is connected between the second integrated structure (122-123) and the first heat exchanger (111).

4. The closed loop liquid cooler according to claim 1, wherein the first liquid cooling module further comprises a first fan unit (116) installed on the first heat exchanger (111), and the second liquid cooling module further comprises a second fan unit (128) installed on the second heat exchanger (121).

5. An electronic device, comprising the closed loop liquid cooler according to claim 1.

* * * * *